(12) United States Patent
Campbell et al.

(10) Patent No.: US 11,578,925 B2
(45) Date of Patent: Feb. 14, 2023

(54) THERMAL MANAGEMENT SYSTEM FOR A TEST-AND-MEASUREMENT PROBE

(71) Applicant: Tektronix, Inc., Beaverton, OR (US)

(72) Inventors: Julie A. Campbell, Beaverton, OR (US); David Thomas Engquist, Portland, OR (US); Sam J. Strickling, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 62 days.

(21) Appl. No.: 17/096,622

(22) Filed: Nov. 12, 2020

(65) Prior Publication Data

US 2021/0148640 A1    May 20, 2021

Related U.S. Application Data

(60) Provisional application No. 62/936,371, filed on Nov. 15, 2019.

(51) Int. Cl.
*G01R 31/28*   (2006.01)
*F28D 7/10*   (2006.01)

(52) U.S. Cl.
CPC .......... *F28D 7/10* (2013.01); *G01R 31/2849* (2013.01)

(58) Field of Classification Search
CPC .. G01R 1/04; G01R 31/2849; G01R 31/2862; G01R 31/2875; A61B 18/14; A61B 2017/1205; A61B 2018/00011; A61B 5/0048; A61B 2560/0242; A61B 5/01; A61B 2017/00199; A61B 2017/00092; A61B 2017/00119; G01N 15/1404; G01N 21/8507; G01N 21/3563; G01N 21/49; G01N 5/045; G01N 2030/6013; G01N 2015/003; G01N 1/40; G01N 15/06; F24H 9/2014; F24H 4/02; F28D 2021/0029; F28D 2021/0077; F28D 7/10; F28D 7/12; H05K 7/20; H05K 7/20209; H05K 7/20272; H05K 7/20145; H05K 7/20281

See application file for complete search history.

(56) References Cited

U.S. PATENT DOCUMENTS 4,991,957 A * 2/1991 Sakamoto .......... A61B 1/00091
  356/241.4
6,462,529 B1 * 10/2002 Campbell ................ G01R 1/04
  324/754.03
7,121,098 B2 10/2006 Hatcher
(Continued)

*Primary Examiner* — Vinh P Nguyen
(74) *Attorney, Agent, or Firm* — Miller Nash LLP; Andrew J. Harrington

(57) ABSTRACT

A thermal management system for a test-and-measurement probe that includes a thermally insulated shroud and a fluid inlet conduit. The shroud is configured to enclose a first portion of a probe head of the probe within an interior cavity of the shroud, while permitting a second portion of the probe head to extend out of the shroud. The shroud further includes a fluid outlet passageway configured to permit a heat-transfer fluid to pass from a probe-head end of the interior cavity, through the interior cavity of the shroud, and out of the shroud through an access portion of the shroud. The fluid inlet conduit enters the shroud through the access portion of the shroud, extends through the interior cavity of the shroud, and is configured to introduce the heat-transfer fluid to the probe-head end of the interior cavity.

19 Claims, 4 Drawing Sheets

(56) References Cited

U.S. PATENT DOCUMENTS

| | | | | |
|---|---|---|---|---|
| 8,702,704 | B2* | 4/2014 | Shelton, IV | A61B 18/1445 |
| | | | | 606/51 |
| 8,937,482 | B1* | 1/2015 | Lemczyk | G01R 31/2875 |
| | | | | 324/750.04 |
| 9,005,199 | B2* | 4/2015 | Beckman | A61B 18/1445 |
| | | | | 606/52 |
| 9,046,694 | B2* | 6/2015 | Hirata | G02B 23/2492 |
| 10,034,601 | B2* | 7/2018 | Hirata | A61B 1/00135 |

\* cited by examiner

THERMAL MANAGEMENT SYSTEM FOR A TEST-AND-MEASUREMENT PROBE

CROSS-REFERENCES TO RELATED APPLICATIONS

This patent application claims the benefit of provisional Application No. 62/936,371 filed Nov. 15, 2019. That application is incorporated into the present disclosure by this reference.

TECHNICAL FIELD

This disclosure relates to test-and-measurement probes, and more particularly to systems and methods for thermal management of test and measurement probes.

BACKGROUND

Users of test and measurement instruments, such as oscilloscopes, often use probes to connect a Device-Under-Test (DUT), such as a circuit board, to an input of a test and measurement instrument in order to visualize and perform measurements of electrical signals occurring in the DUT. These users are typically engineers designing circuit boards for a wide variety of electronic devices. Consumers of electronic devices generally desire these devices to be as physically small as possible. Accordingly, engineers are often tasked with packing a high quantity of electrical components into a small circuit board area. Additionally, the electrical components themselves are generally designed to be physically smaller with each successive generation. The small size and high density of electrical components in a DUT can make it challenging for engineers to probe test points on a DUT.

Therefore, test and measurement probes must be able to make physical and electrical contact with DUT test points that can be difficult to access, while still providing high bandwidth and good signal fidelity. Test points in a DUT vary considerably in geometry and accessibility. They may reside in a DUT in every angle of orientation from horizontal to vertical. They may be obscured by electrical components. Contemporary high-speed signal busses, such as DDR2, DDR4 and PCIe Gen 4, among others, often use differential signaling, requiring that a probe used to measure these signals must be able to make simultaneous electrical contact with two test points. This may be even more challenging if the two test points are on different planes.

Sometimes a probe may be semi-permanently attached to DUT test points. For example, a "solder-down" type probe may have wires from the probe that are soldered to test points, or that are attached to test points with conductive epoxy, tape, or by other means. This kind of semi-permanent probe attachment scheme can provide a reliable connection to the DUT. However, solder-down probes also have a number of disadvantages. Due to the often poor accessibility of the DUT test points, the process of soldering probe wires to the DUT can be challenging for a probe user, requiring long set-up times and exceptional dexterity. Further, inconsistencies in the quality of the solder connection can cause high variability in signal fidelity, especially at upper frequencies. Additionally, the small gauge of wire used to attach the probe makes it easy for a user to potentially damage the DUT when soldering the wires in place. In order to probe a different set of test points, a user must unsolder and re-solder the wires—a time-consuming process making this type of probe unsuitable for fast debug environments in which a user may need to quickly check several different DUT test points. Finally, this type of solder-down probe tends to wear out after only a few connections, and can be expensive to replace.

To overcome some of these issues, another style of probe, known as a "browser probe," is designed to be held in a user's hand, or with a holding tool, and be positioned by the user to touch one or more test points in a DUT. This type of browser probe is better suited for debug environments in which maximum probe placement flexibility and minimal measurement setup time are desirable. A browser probe may be designed as a single-ended probe, which measures the electrical signal at one test point in a DUT with respect to a ground, or may be designed as a differential probe, which measures electrical signals at two test points in a DUT and produces an output signal based on the difference between the two measured signals.

Configurations of the disclosed technology address shortcomings in the prior art.

DETAILED DESCRIPTION

Figure 1:
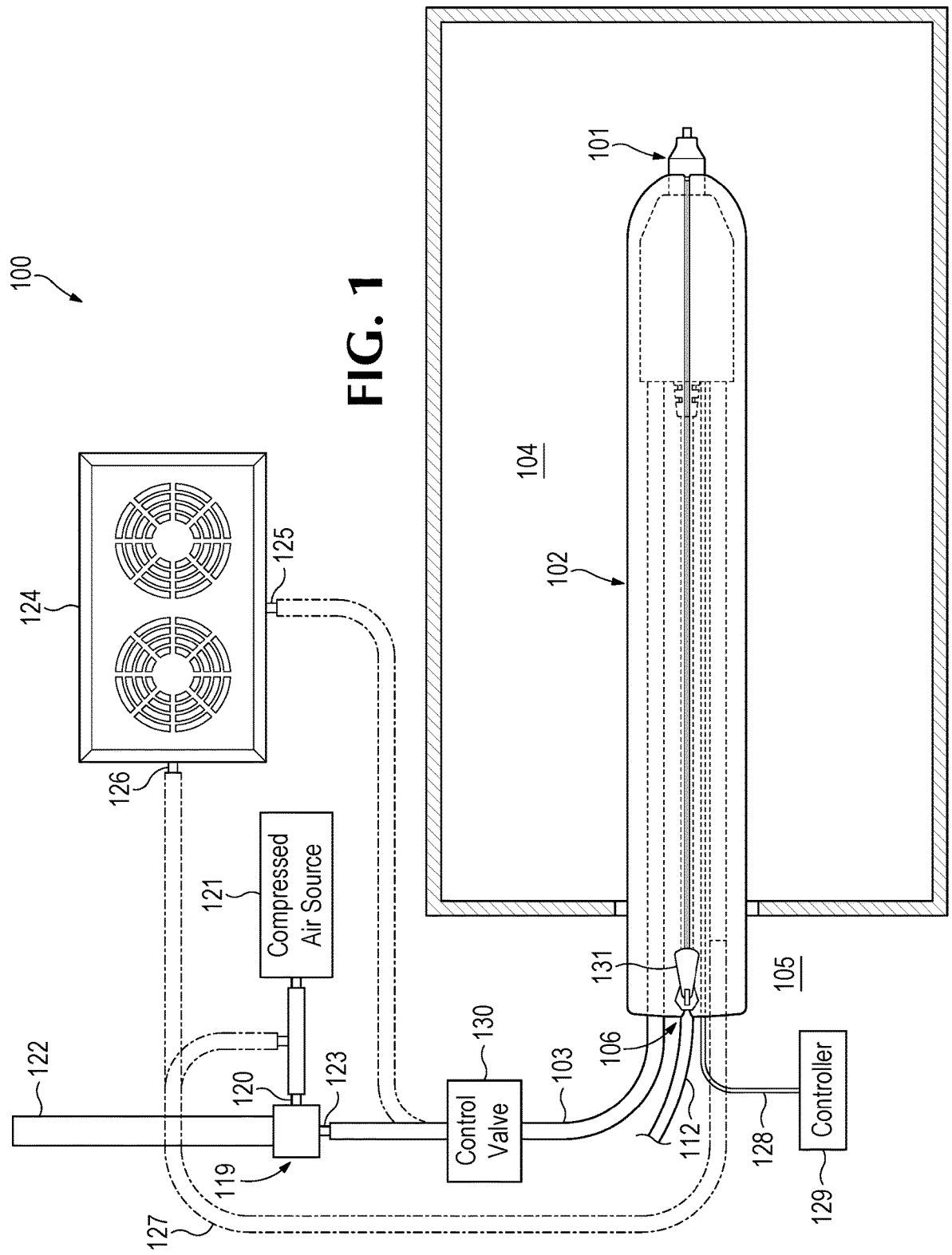
FIG. 1 is a graphical representation of a thermal management system for a test-and-measurement probe, according to an example configuration.

Probes are typically designed for optimal operation at temperature ranges usually found in a laboratory, workshop, bench, or office environment, i.e., around 18-22 degrees Celsius, or around room temperature. Probes may be designed to also operate at expanded temperature ranges, both higher and lower than room temperature to enable temperature margin testing or performance testing of a DUT. For instance, several probes manufactured by Tektronix, Inc., such as the P6247, are specified and designed to operate between o degrees Celsius to 50 degrees Celsius. The upper and lower operating temperature limits of a probe are typically dictated by electrical components used in the probe. For example, in an active probe, an amplifier in the probe tip that performs signal conditioning on a signal received from the DUT may itself have an upper or lower operating temperature limit that dictates the upper and lower operating temperature for the entire probe. Operating the probe, and therefore the electrical components that make up the probe, at temperatures outside the specified operating temperature range of the probe may cause the performance of the components to drift, thereby causing inaccurate probe measurements, or may also damage the probe.

However, in some use cases, a user may desire to connect a probe to a DUT, and make a measurement of the DUT, in an environmental temperature that exceeds the operating temperature specifications of the probe. For example, the DUT may be a circuit board or other electrical device or module that is being designed for use in an automobile. In these cases, the required operating temperature range for the DUT may greatly exceed the temperature specs of the probe. For example, the DUT may be required to operate down to at least −5 degrees Celsius, −10 degrees Celsius, or even −20 degrees Celsius, and up to at least 100 degrees Celsius, 125 degrees Celsius, 150 degrees Celsius, or even 175 degrees Celsius.

In order for a user to validate that a DUT is meeting these specifications, the user may place the DUT into, and operate the DUT within a controlled temperature chamber. To measure the performance of the DUT, the user may also place the probe attached to the DUT into the chamber, with the probe cable extending outside of the chamber, through an access port, to connect to an input of a test and measurement instrument. Thus, the probe is subjected to the same environmental temperatures as the DUT, which often exceed the specified operating temperature of the probe. In some circumstances, the temperature at the probe is also inconsistent. For example, the user may run a schedule of tests varying from 0 degrees Celsius up to 175 degrees Celsius and back down. Under previously existing technology, the user would have to either switch probes as the temperature changes to match the needs of the tests, live with uncertainties for a single probe when it reads out of range, or physically damage the probe—sometimes beyond repair.

As described herein, aspects are directed to a thermal management system for a test-and-measurement probe. Versions of the disclosed technology manage the temperature to which the probe is subjected, to bring the probe within, or closer to, its specified operating temperature range so that the probe will properly measure the DUT. In addition, versions allow for tight control of the temperature of the probe to allow the probe to obtain very precise measurements. Accordingly, configurations provide heat-transfer fluid to cool portions of the test-and-measurement probe without influencing the temperature of the testing environment, meaning the controlled temperature chamber where the DUT is located, therefore ensuring the accuracy of the measured results.

Figure 2:
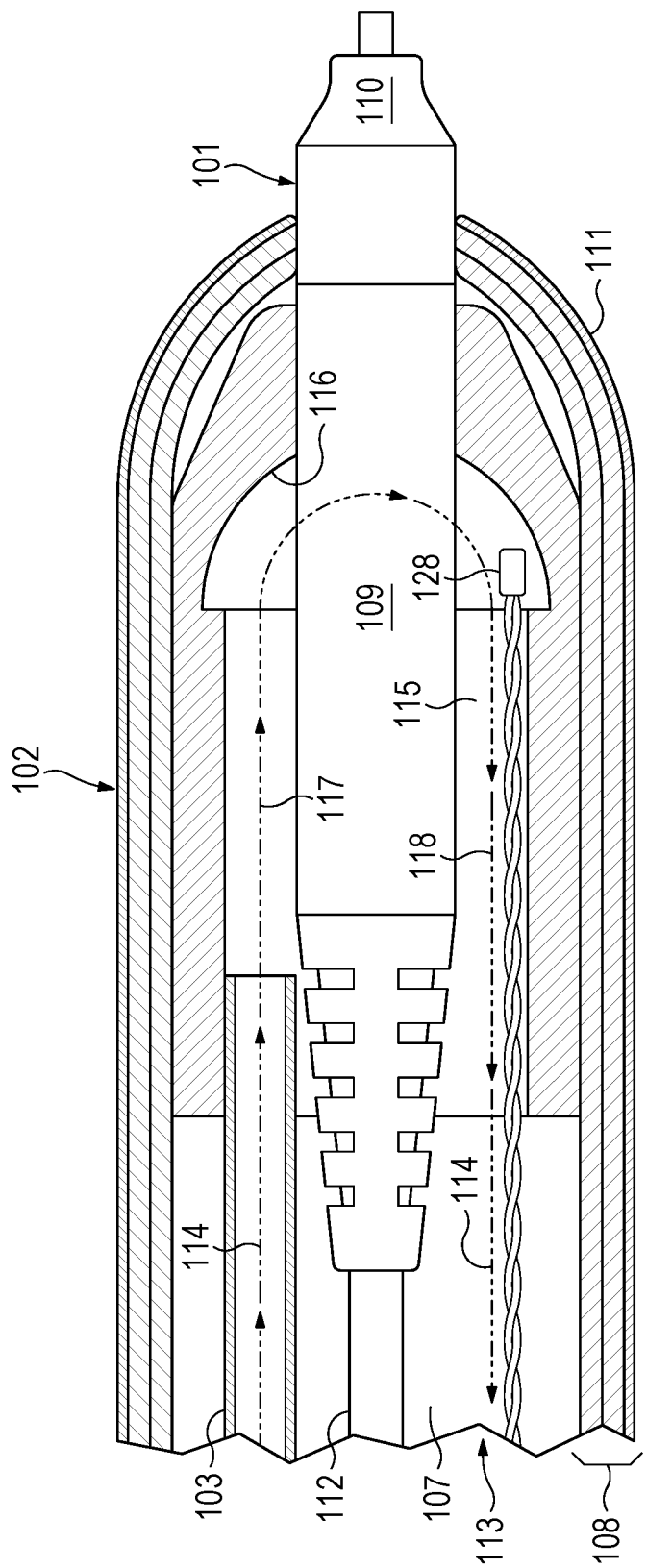
FIG. 2 is a partial cutaway of a portion of the thermal management system of FIG. 1.

FIG. 1 is a graphical representation showing portions of a thermal management system 100 for a test-and-measurement probe, according to an example configuration. FIG. 2 is a partial cutaway of a portion of the thermal management system 100 of FIGS. 1-2. As illustrated in FIGS. 1-2, a thermal management system 100 for a probe head 101 of a test-and-measurement probe may include a shroud 102 and a fluid inlet conduit 103.

In FIG. 1, portions of the thermal management system 100 are illustrated as being within a testing environment 104. The testing environment 104 may be, for example, an environment having a temperature higher or lower than the temperature of a region 105 exterior to the shroud 102. Consequently, the testing environment 104 may be, for example, a controlled temperature chamber such as an oven, a refrigerator, or a freezer. Accordingly, the shroud 102 may, for example, be inserted through an access port in the controlled temperature chamber. It is noted that the indicated region 105 exterior to the shroud 102 is also exterior to the testing environment 104 when the shroud 102 is installed in a testing environment 104 as in the example illustrated in FIGS. 1-2. The testing environment 104 may also be somewhere other than a controlled temperature chamber, such as an interior portion of an automobile engine, for example.

The shroud 102 may be configured to be substantially airtight and thermally insulated other than at an access portion 106 of the shroud 102. As used in this disclosure, "substantially airtight" means largely or essentially preventing air or other fluids from escaping through the material of the shroud 102 itself, without requiring a perfect seal. In particular, it is understood that an interior cavity 107 of the shroud 102 is connected to the region 105 exterior to the shroud 102 through the access portion 106 of the shroud 102, as discussed elsewhere in this disclosure. The connection from the interior cavity 107 of the shroud 102, through the access portion 106 of the shroud 102, to the region 105 exterior to the shroud 102 is not through the material of the shroud 102 itself since the access portion is an opening in the shroud 102. Hence, the shroud 102 is substantially airtight with respect to air or another fluid passing through the shroud 102 and into the testing environment 104.

As used in this disclosure, "thermally insulated," with respect to the shroud 102, means largely or essentially preventing the transfer of heat through the material of the shroud 102 itself, without requiring a perfect barrier to all heat transfer. In configurations, the shroud 102 may include layers 108 of insulating materials. For example, one or more layers 108 of insulating materials could be or include polyester batting. In versions, the polyester batting may include a reflective backing configured to reflect infrared energy.

The shroud 102 may be configured to accept and substantially enclose a first portion 109 of the probe head 101 within the interior cavity 107 of the shroud 102, while permitting a second portion 110 of the probe head 101 to extend out of a probe-head end 111 of the shroud 102. As used in this disclosure, "substantially enclose," with respect to the shroud 102, means largely or essentially surrounding on all sides, without requiring perfect encasement. For example, it is understood that the second portion 110 of the probe head 101 extends out of the probe-head end 111 of the shroud 102. In addition, it is understood that one or more probe cables 112 of the probe head 101 as well as the fluid inlet conduit 103, may extend out from the access portion 106 of the shroud 102. In example configurations, the second portion 110 of the probe head 101, which may sometimes be referred to as a tip holder, may be configured to accept and hold various types of probe tips.

As illustrated in FIGS. 1-2, the probe-head end 111 of the shroud 102 is opposite and does not coincide with the access portion 106 of the shroud 102. The probe-head end 111 of the shroud 102 may include a seal or sealant to permit the second portion 110 of the probe head 101 to extend out of the probe-head end 111 of the shroud 102 while the shroud 102 remains substantially airtight and thermally insulated. In addition, the interior cavity 107 of the shroud 102 is connected to the region 105 exterior to the shroud 102 through the access portion 106 of the shroud 102. The access portion 106 of the shroud 102 may also include a seal or sealant, or maybe cinched or otherwise secured, to permit the one or more probe cables 112, the fluid inlet conduit 103, etc., to extend out of the access portion 106 of the shroud 102, while the shroud 102 remains substantially airtight and thermally insulated.

The shroud 102 further includes a fluid outlet passageway 113 configured to permit a heat-transfer fluid 114 to pass from a probe-head end 115 of the interior cavity 107, through the interior cavity 107 of the shroud 102, and out of the shroud 102 through the access portion 106 of the shroud 102. The probe-head end 115 of the interior cavity 107 of the shroud 102 is opposite the access portion 106 of the shroud 102, As the heat-transfer fluid 114 passes through the interior cavity 107 of the shroud 102 on the way out of the shroud 102, the heat-transfer fluid 114 is applied to the probe cable 112 extending from the probe head 101. Accordingly, the probe cable 112 may be cooled or heated, depending on the relative temperature of the heat-transfer fluid 114.

The heat-transfer fluid 114 may be, for example, air, water, or some other suitable fluid. In configurations where the heat-transfer fluid 114 is air, the air may be supplied by a compressed-air source 121. The compressed-air source 121 may include a filter to reduce water and particulates in the air. The compressed-air source 121 may, for example, provide compressed air at a pressure between about 80 PSIG and about 100 PSIG.

In versions, the shroud 102 may be substantially flexible and is configured to wrap around the first portion 109 of the probe head 101. As used in this disclosure, "substantially flexible," with respect to the shroud 102, means largely or essentially pliable, without requiring perfect pliability across the whole of the shroud 102. The shroud 102 may include a zipper, hook-and-loop, snap closure, or other fastener 131 to allow the shroud 102 to be wrapped around the first portion 109 of the probe head 101 while remaining substantially airtight and thermally insulated. Wrapping the shroud 102 around the first portion 109 of the probe head 101 allows a user to more easily install the shroud 102 onto a probe instead of having to feed or fish the probe head 101 through the length of the shroud 102 from access portion 106 to probe-head end 111.

The fluid inlet conduit 103 enters the shroud 102 through the access portion 106 of the shroud 102, extends through the interior cavity 107 of the shroud 102, and is configured to introduce the heat-transfer fluid 114 to the probe-head end 115 of the interior cavity 107. In versions, the fluid inlet conduit 103 comprises low-friction tubing with small diameter transitions to reduce losses due to friction. For example, the fluid inlet conduit 103 may be or include smooth wall, contiguous tubing with a continuous cross-section. The fluid inlet conduit 103 may be, for example, an extruded polymeric tube, such as a silicone tube. In configurations, the fluid inlet conduit 103 is rigid or semirigid to prevent the fluid inlet conduit 103 from collapsing when covered by the shroud 102 during normal operation. Accordingly, a rigid or semirigid fluid inlet conduit 103 may reduce crimping or kinking of the fluid inlet conduit 103 and, thus, frictional losses as the heat-transfer fluid 114 passes through the fluid inlet conduit 103. However, preferably, the fluid inlet conduit 103 is still flexible enough to permit flexible movement of the one or more probe cables 112 to optimally position of the probe head 101 to measure a DUT.

As illustrated in FIGS. 1-2, the thermal management system 100 may also include a diverter 116 at the probe-head end 115 of the interior cavity 107 of the shroud 102. The diverter 116 is configured to change a direction of flow of the heat-transfer fluid 114 from an incoming direction 117 to an outgoing direction 118. In versions, the fluid inlet conduit 103 terminates within the diverter 116. Hence, the incoming heat-transfer fluid 114 may first contact the diverter 116 after exiting the fluid inlet conduit 103 within the diverter 116. As illustrated in FIGS. 1-2, the outgoing direction 118 may be opposite to the incoming direction 117, the heat-transfer fluid 114 having made a "U-turn" by flowing through the diverter 116.

As illustrated in FIGS. 1-2, the thermal management system 100 may also include a fluid supply system configured to introduce the heat-transfer fluid 114 to the fluid inlet conduit 103. The applicant intends to encompass within the language "fluid supply system" any structure presently existing or developed in the future that performs the same function of introducing the heat-transfer fluid 114 to the fluid inlet. In versions, a first portion of the fluid inlet conduit 103 may be integrated with, or built into, the shroud 102, a second portion of the fluid inlet conduit 103 may connect to the fluid supply system, and the first and second portions may be detachably connected using a quick-connect coupling, or other coupling mechanism.

In versions, the fluid supply system may include a vortex tube 119. A vortex tube 119 is a known mechanical device that separates a compressed gas into a hot stream, which exits the vortex tube 119 from a hot outlet 122, and a cold stream, which exits the vortex tube 119 from a cold outlet 123. Compressed air (from, for example, the compressed-air source 121) is supplied to the vortex tube 119 at the inlet port 120, also referred to in this document as the return side of the vortex tube 119. The reason for this terminology will be apparent in the discussion below about the fluid outlet conduit 127.

Accordingly, the vortex tube 119 may provide either hot gas (from the hot outlet 122) or cold gas (from the cold outlet 123), where hot and cold are relative to each other and to the temperature of the compressed gas before it enters the vortex tube 119. By way of example, in configurations, gas exiting the cold outlet 123 may reach temperatures of down to about −50° C. (−60° F.), and gas exiting the hot outlet 122 may reach temperatures of up to about 200° C. (390° F.). The vortex tube 119 maybe, for example, a vortex tube 119 having a flow capacity of about four cubic feet per minute when supplied with compressed gas at about 100 PSIG. In such a configuration, the vortex tube 119 may provide about 200 BTU per hour of cooling capacity as one example.

Accordingly, in configurations the fluid inlet conduit 103 maybe coupled to the cold outlet 123 of the vortex tube 119 to introduce cold heat-transfer fluid 114 to the probe-head end 115 of the interior cavity 107 in a cooling mode of the vortex tube 119. Alternatively, in configurations the fluid inlet conduit 103 may be coupled to the hot outlet 122 of the vortex tube 119 to introduce hot heat-transfer fluid 114 to the probe-head end 115 of the interior cavity 107 in a heating mode of the vortex tube 119.

In versions, the fluid supply system includes a thermoelectric cooler or heater 124. Thermoelectric coolers and heaters are known devices that uses the Peltier effect to create a heat flux between two different types of materials. As used in the disclosure, the term Peltier device 124 means a thermoelectric cooler or a thermoelectric heater. Because of the heat flux, Peltier devices have a hot side and a cold side and, so, can be used to either heat or cool. In configurations where the Peltier device 124 is used to heat the heat-transfer fluid 114, the hot side is the active side 125 of the Peltier device 124, and the cold side of the Peltier device 124 is referred to as the return side 126 of the Peltier device 124. Likewise, in configurations where the Peltier device 124 is used to cool the heat-transfer fluid 114, the cold side is the active side 125 of the Peltier device 124, and the hot side of the Peltier device 124 is referred to as the return side 126 of the Peltier device 124. The reason for this terminology will be apparent in the discussion below about the fluid outlet conduit 127. As illustrated in FIG. 1, the Peltier device 124 may be external to the shroud 102.

Figure 4:
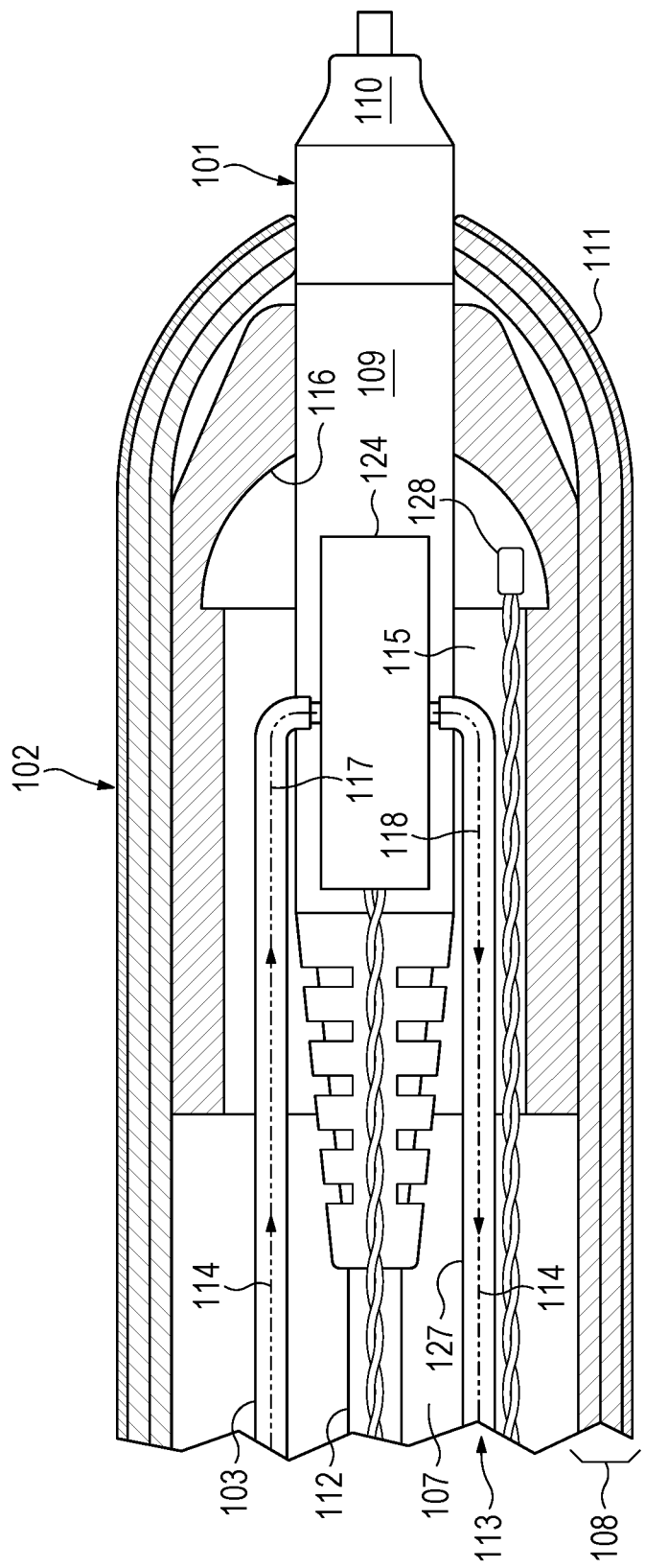
FIG. 4 is a partial cutaway of a portion of a thermal management system, similar to the view of FIG. 2, but illustrating a version with an internal Peltier device.

Alternatively or additionally, as illustrated in FIG. 4, the Peltier device 124 may be within the shroud 102. In such versions, in a cooling mode of the Peltier device 124, the cold side of the Peltier device 124 may be in contact with the first portion 109 of the probe head 101 and also (or instead) a portion of the probe cable 112 attached to the probe head 101. In the cooling mode, the heat-transfer fluid 114 may pass over the hot side of the Peltier device 124 before the heat-transfer fluid 114 contacts the first portion 109 of the probe head 101. Likewise, in a heating mode of the Peltier device 124, the hot side of the Peltier device 124 may be in contact with the first portion 109 of the probe head 101 and also (or instead) a portion of the probe cable 112 attached to the probe head 101. In the heating mode, the heat-transfer fluid 114 may pass over the cold side of the Peltier device 124 before the heat-transfer fluid 114 contacts the first portion 109 of the probe head 101.

In versions, the fluid inlet conduit 103 may extend to the internal Peltier device 124 and the fluid outlet conduit 127 (discussed below) may likewise extend to the internal Peltier device 124. Accordingly, in versions having internal Peltier device 124, the heat-transfer fluid 114 may provide a heat flux to, for example, carry away excess heat from the internal Peltier device 124. In versions, the Peltier device 124 may be in contact with the probe head 101 and also (or instead) the probe cable 112 as noted, but there may be no shroud 102. Versions having the Peltier device 124 in contact with the probe head 101 may have a quicker response to temperature control measures, as discussed below for the temperature controller 129, because of the smaller volume of heat-transfer fluid 114 where, for example, the fluid inlet conduit 103 does not extend to a vortex tube 119 or Peltier device 124 that is external to the shroud 102. In versions, the internal Peltier device 124 may be built-into, or integrated with, the probe head 101, in particular the first portion 109 of the probe head 101.

Returning to FIGS. 1 and 2, in versions, the thermal management system 100 may also include a fluid outlet conduit 127 connecting the fluid outlet passageway 113 to the return side 120, 126 of the fluid supply system. In such configurations, the heat-transfer fluid 114 exiting the shroud 102 may be returned to the fluid supply system (such as, for example, the vortex tube 119 or the Peltier device 124) for repeated cooling or heating. The fluid outlet conduit 127 may include low-friction tubing with small diameter transitions to reduce losses due to friction. In versions, a first portion of the fluid outlet conduit 127 may be integrated with, or built into, the shroud 102, a second portion of the fluid outlet conduit 127 may connect to the return side 120, 126 of the fluid supply system, and the first and second portions may be detachably connected using a quick-connect coupling, or other coupling mechanism.

As illustrated in FIGS. 1-2, the thermal management system 100 may also include a temperature-sensing device 128 configured to sense temperature at the probe-head end 115 of the interior cavity 107 of the shroud 102. The temperature-sensing device 128 may be, as examples, a thermocouple or a visual indicator of temperature, such as a color-changing material. The temperature-sensing device 128 may be, for example, within the interior cavity 107 of the shroud 102 as illustrated in FIG. 1. As another example, the temperature-sensing device 128 may be within the probe head 101.

In versions, the thermal management system 100 may also include a temperature controller 129 configured to receive an indication of sensed temperature from the temperature-sensing device 128 and to adjust one or both of a temperature of the heat-transfer fluid 114 or a flow rate of the heat-transfer fluid 114 in response to the indication of sensed temperature. For example, the temperature controller 129 may issue instructions to a control valve 130 between the fluid supply system and the fluid inlet conduit 103. As another example, the temperature controller 129 may issue instructions to the Peltier device 124 to, for example, increase current or decrease current, thereby adjusting the temperatures of the hot side and the cold side. In versions, the thermal management system 100 may also or instead access a temperature-sensing device that is integrated with the probe head 101 of the test-and-measurement probe. The temperature controller 129 may be, for example, external to the shroud 102, internal to the shroud 102, part of the probe head 101, part of the test-and-measurement instrument, or in another suitable location.

Using implementations having a vortex tube 119 in cooling mode as an example, to set up and operate the system 100 the user encloses the first portion 109 of the probe head 101 of the test-and-measurement probe within the interior cavity 107 of the shroud 102. For example, the user may insert the probe head 101 into the diverter 116 and then wrap the shroud 102 around the first portion 109 of the probe head 101 as well as a portion of the probe cable 112 attached to the probe head 101. The second portion 110 of the probe head 101 extends out of a probe-head end 111 of the shroud 102. If necessary, and if not already in the testing environment 104, the probe head 101 and shroud 102 can be inserted into the testing environment 104, such as through a port in the controlled temperature chamber serving as the testing environment 104.

The user may then attach a compressed-air source 121 to the inlet port 120 of the vortex tube 119. The compressed air passes through the vortex tube 119. When the system 100 is configured in a cooling mode, cooled air exits the cold outlet 123 of the vortex tube 119 and enters the fluid inlet conduit 103, where the cooled air flows into the shroud 102 through the access portion 106 of the shroud 102 and then through the interior cavity 107 of the shroud 102 to the probe-head end 115 of the interior cavity 107.

At this point, the cooled air strikes the diverter 116, which runs the cooled air around most of the first portion 109 of the probe head 101, thus cooling the first portion 109 of the probe head 101. The first portion 109 of the probe head 101 is generally where temperature-sensitive, but also heat-generating, active components of the probe head 101 reside, such as an amplifier. Thus, the cooled air serves to regulate the temperature of the components within the first portion 109 of the probe head 101. Some of the heat generated by these components will be transferred to the passing heat-transfer fluid 114. The diverter 116 also changes the direction of the still cool, but slightly warmer, air from the incoming direction 117 (the direction of flow from the fluid inlet conduit 103) to the outgoing direction 118 (the direction of flow as the air passes back toward the access portion 106 of the shroud 102). After the cool air leaves the diverter 116, it enters the fluid outlet passageway 113 to pass from the probe-head end 115 of the interior cavity 107, through the interior cavity 107 of the shroud 102, and out of the shroud 102 through the access portion 106 of the shroud 102. While passing through the interior cavity 107 of the shroud 102, the cool air may also cool the section of the probe cable 112 that is within the shroud 102.

Once the air leaves the shroud 102 through the access portion 106 of the shroud 102, the air may be vented into the region 105 exterior to the shroud 102. Alternatively, the air leaving the shroud 102 may enter the fluid outlet conduit 127 to be transported elsewhere, such as the return side 120 of the vortex tube 119.

Figure 3:
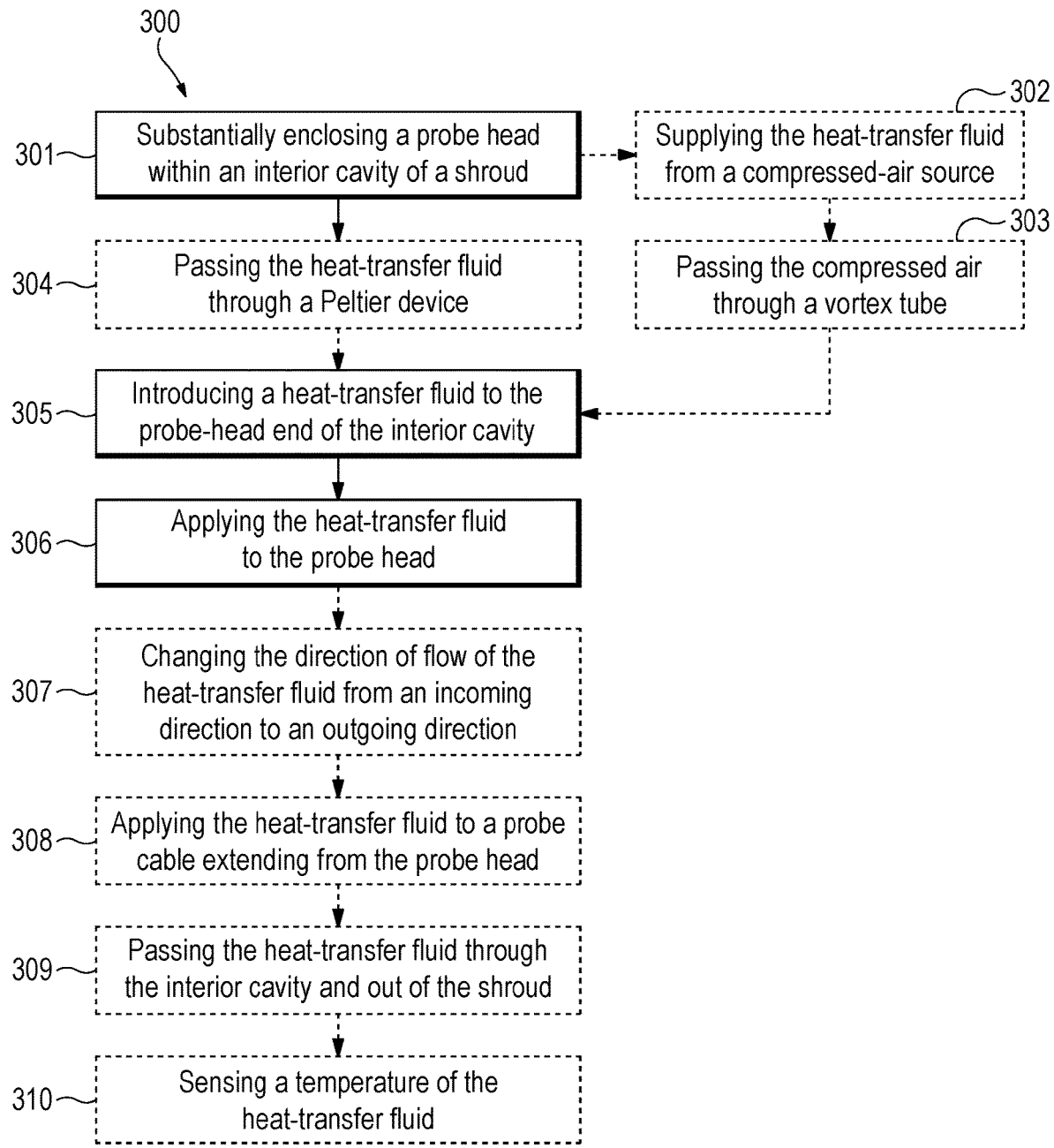
FIG. 3 illustrates an example method of managing temperature of a probe head of a test-and-measurement probe.

FIG. 3 illustrates an example method of managing temperature of a probe head 101 of a test-and-measurement probe. With reference to FIGS. 1-3, a method 300 of managing temperature of a probe head 101 may include substantially enclosing 301 a first portion of a probe head 101 of a test-and-measurement probe within an interior cavity 107 of a shroud 102, while permitting a second portion 110 of the probe head 101 to extend out of a probe-head end 111 of the shroud 102, the shroud 102 being substantially airtight and thermally insulated other than at an access portion 106 of the shroud 102, the access portion 106 of the shroud 102 being opposite a probe-head end 115 of the interior cavity 107 of the shroud 102; introducing 305 a heat-transfer fluid 114 to the probe-head end 115 of the interior cavity 107 through a fluid inlet conduit 103 entering the shroud 102 through the access portion 106 of the shroud 102 and extending through the interior cavity 107 of the shroud 102; applying 306 the heat-transfer fluid 114 to the first portion 109 of the probe head 101; and passing 309, via a fluid outlet passageway 113, the heat-transfer fluid 114 from the probe-head end 115 of the interior cavity 107, through the interior cavity 107 of the shroud 102, and out of the shroud 102 through the access portion 106 of the shroud 102.

In versions, the method may include, after applying 306 the heat-transfer fluid 114 to the first portion 109 of the probe head 101, applying 308 the heat-transfer fluid 114 to a probe cable 112 extending from the probe head 101.

In versions, the method may include supplying 302 the heat-transfer fluid 114 from a compressed-air source 121, the heat-transfer fluid 114 comprising compressed air; and passing 303 the compressed air through a vortex tube 119 before introducing 305 the heat-transfer fluid 114 to the probe-head end 115 of the interior cavity 107.

In versions, the method may include passing 304 the heat-transfer fluid 114 through a Peltier device 124 to alter a temperature of the heat-transfer fluid 114 before introducing 305 the heat-transfer fluid 114 to the probe-head end 115 of the interior cavity 107.

In versions, the method may include changing 307 a direction of flow of the heat-transfer fluid 114 from an incoming direction 117 to an outgoing direction 118 at the probe-head end 115 of the interior cavity 107 of the shroud 102.

In versions, the method may include sensing 310 a temperature of the heat-transfer fluid 114 at the probe-head end 115 of the interior cavity 107 of the shroud 102.

Accordingly, configurations of the disclosed technology provide heat-transfer fluid to cool portions of the test-and-measurement probe without influencing the temperature of the testing environment. Hence, versions of the disclosed technology manage the temperature to which the probe is subjected, to bring the probe within, or closer to, its specified operating temperature range so that the probe will properly measure the DUT.

EXAMPLES

Illustrative examples of the disclosed technologies are provided below. A particular configuration of the technologies may include one or more, and any combination of, the examples described below.

Example 1 includes a thermal management system for a test-and-measurement probe, the thermal management system comprising: a thermally insulated shroud configured to enclose a first portion of a probe head of a test-and-measurement probe within an interior cavity of the shroud, while permitting a second portion of the probe head to extend out of the shroud the interior cavity of the shroud communicating with a region exterior to the shroud through an access portion of the shroud, the shroud further comprising a fluid outlet passageway configured to permit a heat-transfer fluid to pass from a probe-head end of the interior cavity, through the interior cavity of the shroud, and out of the shroud through the access portion of the shroud; and a fluid inlet conduit entering the shroud through the access portion of the shroud, extending through the interior cavity of the shroud, and configured to introduce the heat-transfer fluid to the probe-head end of the interior cavity.

Example 2 includes the thermal management system of Example 1, further comprising a fluid supply system configured to introduce the heat-transfer fluid to the fluid inlet.

Example 3 includes the thermal management system of Example 2, further comprising a fluid outlet conduit connecting the fluid outlet passageway to a return side of the fluid supply system.

Example 4 includes the thermal management system of any of Examples 2-3, in which the fluid supply system comprises a vortex tube.

Example 5 includes the thermal management system of Example 4, in which the fluid inlet conduit is coupled to a cold outlet of the vortex tube.

Example 6 includes the thermal management system of Example 4, in which the fluid inlet conduit is coupled to a hot outlet of the vortex tube.

Example 7 includes the thermal management system of any of Examples 2-6, in which the fluid supply system comprises a thermoelectric cooler.

Example 8 includes the thermal management system of any of Examples 2-6, in which the fluid supply system comprises a thermoelectric heater.

Example 9 includes the thermal management system of any of Examples 1-8 further comprising a temperature-sensing device configured to sense temperature at the probe-head end of the interior cavity of the shroud.

Example 10 includes the thermal management system of Example 9, further comprising a temperature controller configured to receive an indication of sensed temperature from the temperature-sensing device and to adjust one or both of a temperature of the heat-transfer fluid or a flow rate of the heat-transfer fluid in response to the indication of sensed temperature.

Example 11 includes the thermal management system of any of Examples 1-10, further comprising a diverter at the probe-head end of the interior cavity of the shroud, the diverter configured to change a direction of flow of the heat-transfer fluid from an incoming direction to an outgoing direction.

Example 12 includes the thermal management system of Example 11, in which the fluid inlet conduit terminates within the diverter.

Example 13 includes the thermal management system of any of Examples 1-12, in which the shroud is substantially flexible and is configured to wrap around the first portion of the probe head.

Example 14 includes a method of managing temperature of a probe head of a test-and-measurement probe, the method comprising: enclosing a first portion of a probe head of a test-and-measurement probe within an interior cavity of a thermally insulated shroud, while permitting a second portion of the probe head to extend out of the shroud; and managing a temperature of the probe head by applying a heat-transfer fluid within the shroud to the first portion of the probe head.

Example 15 includes the method of Example 14, in which managing the temperature of the probe head by applying the heat-transfer fluid within the shroud to the first portion of the probe head further comprises: introducing the heat-transfer fluid to the probe-head end of the interior cavity through a fluid inlet conduit entering the shroud through an access portion of the shroud and extending through the interior cavity of the shroud; and passing, via a fluid outlet passageway, the heat-transfer fluid from the probe-head end of the interior cavity, through the interior cavity of the shroud, and out of the shroud through the access portion of the shroud.

Example 16 includes the method of either Example 14 or Example 15, further comprising, after applying the heat-transfer fluid to the first portion of the probe head, applying the heat-transfer fluid to a probe cable extending from the probe head.

Example 17 includes the method of any of Examples 14-16, further comprising: supplying the heat-transfer fluid from a compressed-air source, the heat-transfer fluid comprising compressed air; and passing the compressed air through a vortex tube before introducing the heat-transfer fluid to the probe-head end of the interior cavity.

Example 18 includes the method of any of Examples 14-17, further comprising passing the heat-transfer fluid through a Peltier device to alter a temperature of the heat-transfer fluid before introducing the heat-transfer fluid to the probe-head end of the interior cavity.

Example 19 includes the method of any of Examples 14-18, further comprising sensing a temperature of the heat-transfer fluid at the probe-head end of the interior cavity of the shroud.

Example 20 includes the method of any of Examples 14-19, further comprising changing a direction of flow of the heat-transfer fluid from an incoming direction to an outgoing direction at the probe-head end of the interior cavity of the shroud.

Aspects may operate on a particularly created hardware, on firmware, digital signal processors, or on a specially programmed general purpose computer including a processor operating according to programmed instructions. The terms "controller" or "processor" as used herein are intended to include microprocessors, microcomputers, ASICs, and dedicated hardware controllers. One or more aspects may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various configurations. In addition, the functionality may be embodied in whole or in part in firmware or hardware equivalents such as integrated circuits, field programmable gate arrays (FPGA), and the like. Particular data structures may be used to more effectively implement one or more aspects of the disclosed systems and methods, and such data structures are contemplated within the scope of computer executable instructions and computer-usable data described herein.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular example configuration, that feature can also be used, to the extent possible, in the context of other example configurations.

Also, when reference is made in this application to a method having two or more defined steps or operations, the defined steps or operations can be carried out in any order or simultaneously, unless the context excludes those possibilities.

Furthermore, the term "comprises" and its grammatical equivalents are used in this application to mean that other components, features, steps, processes, operations, etc. are optionally present. For example, an article "comprising" or "which comprises" components A, B, and C can contain only components A, B, and C, or it can contain components A, B, and C along with one or more other components.

Although specific example configurations have been described for purposes of illustration, it will be understood that various modifications may be made without departing from the spirit and scope of the disclosure.

What is claimed is:

1. A thermal management system for a test-and-measurement probe, the thermal management system comprising:
a thermally insulated shroud configured to enclose a first portion of a probe head of a test-and-measurement probe within an interior cavity of the shroud, while permitting a second portion of the probe head to extend out of a probe-head end of the shroud, the interior cavity of the shroud communicating with a region exterior to the shroud through an access portion of the shroud, the probe-head end of the shroud is opposite and does not coincide with the access portion of the shroud, the shroud further comprising a fluid outlet passageway configured to permit a heat-transfer fluid to pass from a probe-head end of the interior cavity, through the interior cavity of the shroud, and out of the shroud through the access portion of the shroud; and
a fluid inlet conduit entering the shroud through the access portion of the shroud, extending through the interior cavity of the shroud, and configured to introduce the heat-transfer fluid to the probe-head end of the interior cavity.

2. The thermal management system of claim 1, further comprising a fluid supply system configured to introduce the heat-transfer fluid to the fluid inlet conduit.

3. The thermal management system of claim 2, further comprising a fluid outlet conduit connecting the fluid outlet passageway to a return side of the fluid supply system.

4. The thermal management system of claim 2, in which the fluid supply system comprises a vortex tube.

5. The thermal management system of claim 4, in which the fluid inlet conduit is coupled to a cold outlet of the vortex tube.

6. The thermal management system of claim 4, in which the fluid inlet conduit is coupled to a hot outlet of the vortex tube.

7. The thermal management system of claim 2, in which the fluid supply system comprises a thermoelectric cooler.

8. The thermal management system of claim 2, in which the fluid supply system comprises a thermoelectric heater.

9. The thermal management system of claim 1, further comprising a temperature-sensing device configured to sense temperature at the probe-head end of the interior cavity of the shroud.

10. The thermal management system of claim 9, further comprising a temperature controller configured to receive an indication of sensed temperature from the temperature-sensing device and to adjust one or both of a temperature of the heat-transfer fluid or a flow rate of the heat-transfer fluid in response to the indication of sensed temperature.

11. The thermal management system of claim 1, further comprising a diverter at the probe-head end of the interior cavity of the shroud, the diverter configured to change a direction of flow of the heat-transfer fluid from an incoming direction to an outgoing direction.

12. The thermal management system of claim 11, in which the fluid inlet conduit terminates within the diverter.

13. The thermal management system of claim 1, in which the shroud is substantially flexible and is configured to wrap around the first portion of the probe head.

14. A method of managing temperature of a probe head of a test-and-measurement probe, the method comprising:
enclosing a first portion of a probe head of a test-and-measurement probe within an interior cavity of a thermally insulated shroud, while permitting a second portion of the probe head to pass through the shroud and extend out of a probe-head end of the shroud;
managing a temperature of the probe head by applying a heat-transfer fluid within the shroud to the first portion of the probe head; and
sensing a temperature of the heat-transfer fluid at the probe-head end of the interior cavity of the shroud.

15. The method of claim 14, in which managing the temperature of the probe head by applying the heat-transfer fluid within the shroud to the first portion of the probe head further comprises:
introducing the heat-transfer fluid to the probe-head end of the interior cavity through a fluid inlet conduit entering the shroud through an access portion of the shroud and extending through the interior cavity of the shroud; and
passing, via a fluid outlet passageway, the heat-transfer fluid from the probe-head end of the interior cavity, through the interior cavity of the shroud, and out of the shroud through the access portion of the shroud.

16. The method of claim 14, further comprising, after applying the heat-transfer fluid to the first portion of the probe head, applying the heat-transfer fluid to a probe cable extending from the probe head.

17. The method of claim 14, further comprising:
supplying the heat-transfer fluid from a compressed-air source, the heat-transfer fluid comprising compressed air; and
passing the compressed air through a vortex tube before introducing the heat-transfer fluid to the probe-head end of the interior cavity.

18. The method of claim 14, further comprising passing the heat-transfer fluid through a Peltier device to alter a temperature of the heat-transfer fluid before introducing the heat-transfer fluid to the probe-head end of the interior cavity.

19. The method of claim 14, further comprising changing a direction of flow of the heat-transfer fluid from an incoming direction to an outgoing direction at the probe-head end of the interior cavity of the shroud.

* * * * *